(12) United States Patent  
Barnett

(10) Patent No.: US 7,751,195 B2
(45) Date of Patent: Jul. 6, 2010

(54) ELECTRONIC DEVICE SLIDE AND TILT MECHANISM

(75) Inventor: Ricky Barnett, St. Albans (GB)

(73) Assignee: Nokia Corporation, Espoo (FI)

( * ) Notice: Subject to any disclaimer, the term of this patent is extended or adjusted under 35 U.S.C. 154(b) by 72 days.

(21) Appl. No.: 12/005,891

(22) Filed: Dec. 28, 2007

(65) Prior Publication Data

US 2009/0168369 A1 Jul. 2, 2009

(51) Int. Cl.
*H05K 7/16* (2006.01)

(52) U.S. Cl. ............ 361/727; 361/679.55; 361/679.56; 248/917

(58) Field of Classification Search ............... 361/727, 361/679.55, 679.56; 248/917
See application file for complete search history.

(56) References Cited

U.S. PATENT DOCUMENTS

| 5,946,187 A * | 8/1999 | Cipolla ............... 361/679.27 |
| 6,542,721 B2 * | 4/2003 | Boesen ................ 455/553.1 |
| 7,031,036 B2 * | 4/2006 | Chao ...................... 358/497 |
| 7,107,084 B2 * | 9/2006 | Duarte et al. ............ 455/575.3 |
| 7,333,323 B1 * | 2/2008 | Dawson et al. ......... 361/679.27 |
| 2008/0144265 A1 * | 6/2008 | Aoki ......................... 361/681 |

FOREIGN PATENT DOCUMENTS

JP 07-004130 1/1995

OTHER PUBLICATIONS www.wirelessinfo.com (Cell Blog).
www.america.htc.com (Blackberry Connect for the AT&T Tilt) pp. 1-7.

* cited by examiner

*Primary Examiner*—Jayprakash N Gandhi
*Assistant Examiner*—Ingrid Wright
(74) *Attorney, Agent, or Firm*—Harrington & Smith

(57) ABSTRACT

Disclosed herein is an apparatus. The apparatus includes a housing, electronic circuitry, a first arm member, and a spring. The housing includes a first housing section and a second housing section. The electronic circuitry is mounted in the housing. The first arm member is connected between the first housing section and the second housing section. The first arm member is configured to move a portion of the second housing section away from the first housing section. The spring is connected between the second housing section and the first arm member. The spring is configured to exert a torque between the second housing section and the first arm member.

18 Claims, 6 Drawing Sheets

ELECTRONIC DEVICE SLIDE AND TILT MECHANISM

BACKGROUND OF THE INVENTION

1. Field of the Invention

The invention relates to an electronic device and, more particularly, to a slide and tilt mechanism for an electronic device.

2. Brief Description of Prior Developments

As electronic devices continue to become more sophisticated, these devices provide an increasing amount of functionality by including such applications as, for example, a mobile phone, digital camera, video camera, navigation system, gaming capabilities, and Internet browser applications. Many of these devices with increased functionality have more than one configuration. Fold and slide mechanisms have been widely used in different kinds of mobile electronic devices to accommodate these multiple configurations. For example, Japanese Patent Publication No. 07-004130 discloses a tilt type hinge configuration for an electronic device.

Additionally, there are also recent conventional configurations (such as the AT&T Tilt™ 8925 Kaiser, from High Tech Computer Corp. (HTC)) on the market that combine tilting with sliding so that the display of the device can be opened to allow for better viewing angles as in folding devices. However in the conventional product configurations, the sliding and tilting mechanisms are clearly separate elements.

The conventional solutions have all had either more than two links per side of the product, or the requirement for visible slots in the upper face of the lower part. These conventional solutions also provide volume inefficiencies as they tend to take up a lot of space.

Accordingly, there is a desire to provide an improved mechanism for transforming a two part handset product from a flat closed configuration, to an open and tilted configuration.

SUMMARY OF THE INVENTION

In accordance with one aspect of the invention, an apparatus is disclosed. The apparatus includes a housing, electronic circuitry, a first arm member, and a spring. The housing includes a first housing section and a second housing section. The electronic circuitry is mounted in the housing. The first arm member is connected between the first housing section and the second housing section. The first arm member is configured to move a portion of the second housing section away from the first housing section. The spring is connected between the second housing section and the first arm member. The spring is configured to exert a torque between the second housing section and the first arm member.

In accordance with another aspect of the invention, an apparatus is disclosed. The apparatus includes a housing, electronic circuitry, an arm member, and a resilient member. The housing includes a first housing section and a second housing section. The electronic circuitry is mounted in the housing. The arm member is connected between the first housing section and the second housing section. The resilient member is connected between the second housing section and the arm member. The resilient member is configured to exert a contact force between an edge of the second housing section and the first housing section. The arm member is configured to move the edge of the second housing section along an upper face of the first housing section.

In accordance with another aspect of the invention, an apparatus is disclosed. The apparatus includes a housing, electronic circuitry, a first arm member, and a spring. The housing includes a first housing section and a second housing section. The electronic circuitry is mounted in the housing. The first arm member is connected between the first housing section and the second housing section. The first arm member is configured to move a portion of the second housing section above a top end of the first housing section. The spring is connected between the second housing section and the first arm member. The spring is configured to tilt the second housing member towards the first housing member.

In accordance with another aspect of the invention, a method is disclosed. A housing including a first housing section and a second housing section is provided. Electronic circuitry is installed in the housing. A first arm member is connected between the first housing section and the second housing section. The first arm member is configured to move a portion of the second housing section away from the first housing section. A spring is connected between the second housing section and the first arm member. The spring is configured to exert a torque on the second housing section.

In accordance with another aspect of the invention, an opening mechanism is disclosed. The opening mechanism includes an arm member and a spring. The arm member includes a first end and a second end. The first end is configured to be pivotably connected to a first housing section. The second end is configured to be pivotably connected to a second housing section. The spring is connected to the second end of the arm member. A portion of the spring is configured to be connected to the second housing section. The spring is configured to exert a torque between the second housing section and the arm member.

BRIEF DESCRIPTION OF THE DRAWINGS

The foregoing aspects and other features of the invention are explained in the following description, taken in connection with the accompanying drawings, wherein.

DETAILED DESCRIPTION OF THE PREFERRED EMBODIMENTS

Figure 1:
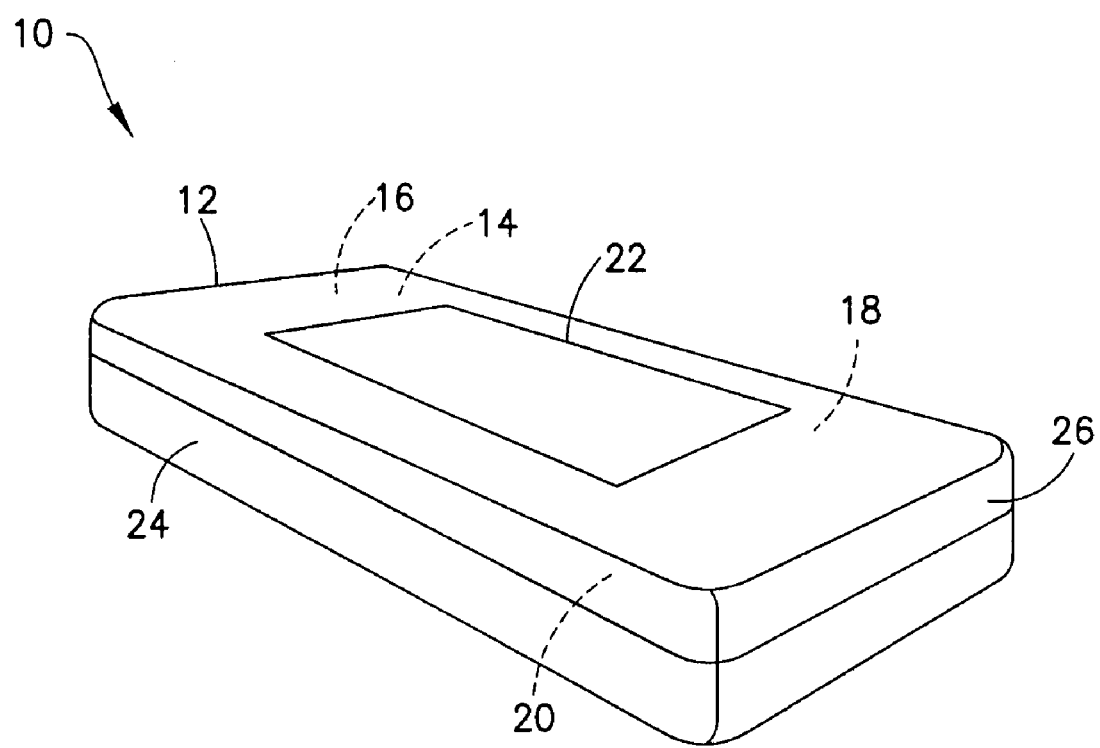
FIG. 1 is a perspective view of an electronic device comprising features of the invention.

Referring to FIG. 1, there is shown a perspective view of an electronic device 10 incorporating features of the invention. Although the invention will be described with reference to the exemplary embodiments shown in the drawings, it should be understood that the invention can be embodied in many alternate forms of embodiments. In addition, any suitable size, shape or type of elements or materials could be used.

In this exemplary embodiment the device 10 is a multifunction portable electronic device. However, in alternate embodiments, features of the exemplary embodiment of this invention could be used in any suitable type of hand-held portable electronic device such as a mobile phone, a gaming device, a music player, or a PDA, for example. In addition, as is known in the art, the device 10 can include features or applications such as a camera, a music player, a game player, or an Internet browser, for example. The device 10 generally comprises a housing 12, a transceiver 14 connected to an antenna 16, electronic circuitry 18, such as a controller for example, within the housing 12, a user input region (which may comprise a keypad for example) 20 and a display 22. The display 22 could also form a user input section, such as a touch screen. The housing 12 includes a first housing section 24 and a second housing section 26. It should be noted that in alternate embodiments, more than two housing sections could be provided. Additionally, in alternate embodiments, the device 10 can have any suitable type of features as known in the art.

Figure 2:
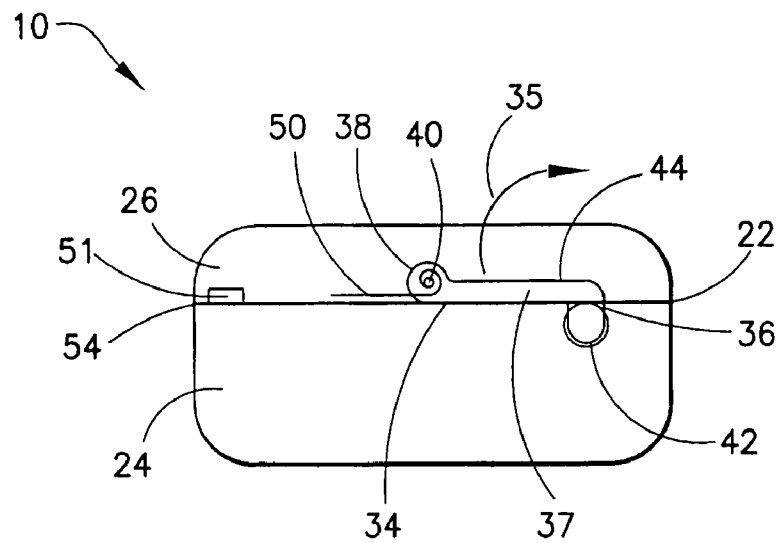
FIG. 2 is a side view of the device shown in FIG. 1 in a closed position, wherein portions of the housing are shown as transparent.
Figure 3:
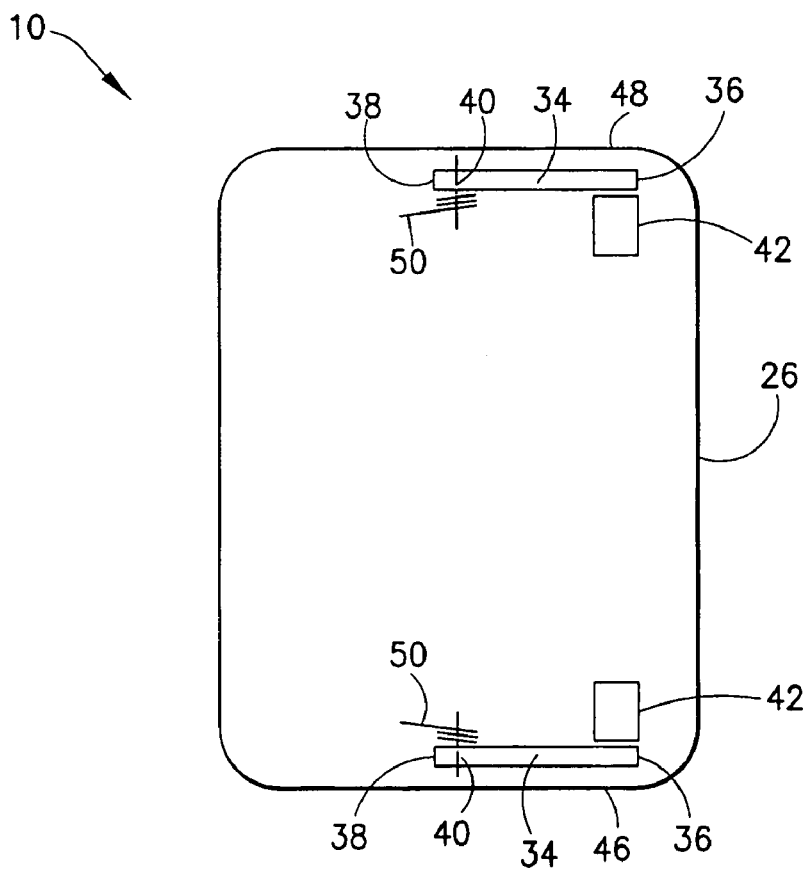
FIG. 3 is a front view of the device shown in FIG. 1 in a closed position, wherein portions of the housing are shown as transparent.
Figure 4:
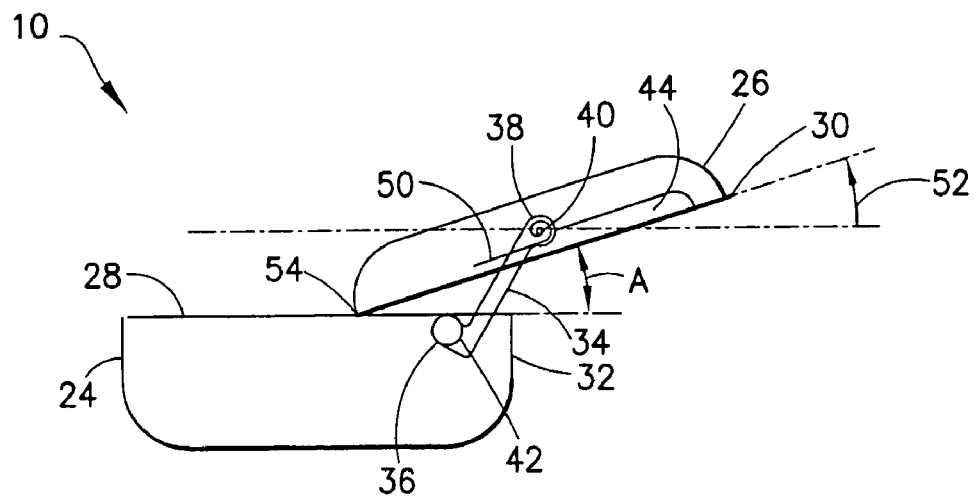
FIG. 4 is an end view of the device shown in FIG. 1 in an open position, wherein portions of the housing are shown as transparent.
Figure 5:
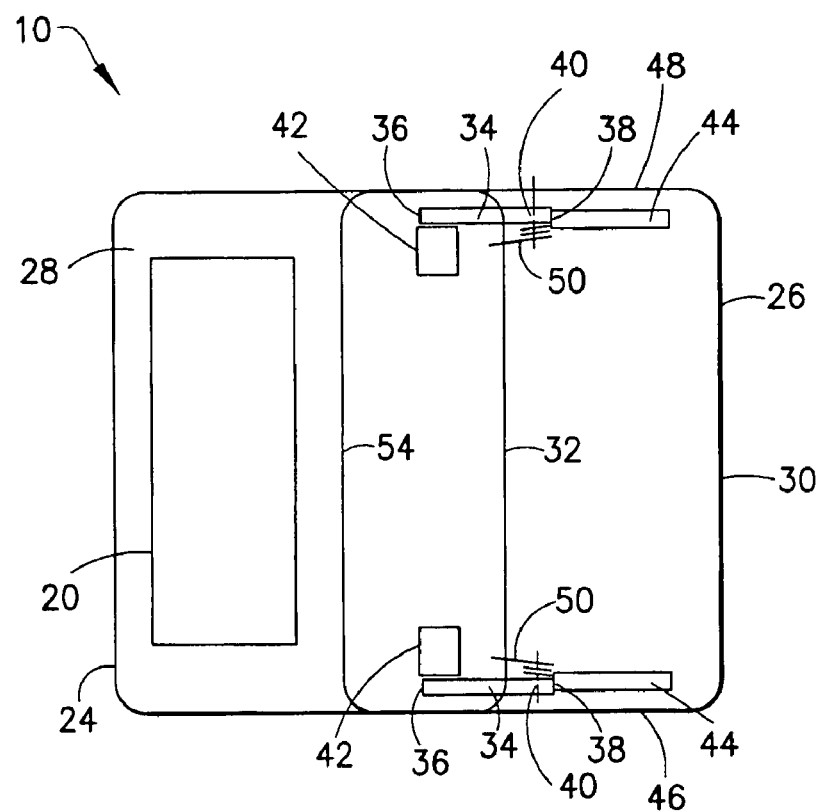
FIG. 5 is a front view of the device shown in FIG. 1 in an open position, wherein portions of the housing are shown as transparent.

The second housing section 26 is movably connected to the first housing section 24 between a closed position as shown in FIGS. 1, 2 and 3, and an open position as shown in FIGS. 4 and 5.

FIGS. 2-5 illustrate front and side views of the device 10. It should be noted that, for the sake of clarity, portions of the housing sections 24, 26 are shown as transparent to further illustrate features of the disclosed device.

In this embodiment, the first housing section 24 comprises a first user input region 20 at an upper face 28 of the first housing section 24. The first user input region 20 may be a keyboard, a keypad, or a keymat, for example. However, it should be noted that alternate embodiments may provide any suitable type of user input region. The first user input region 20 is visible and accessible when the device 10 is in the open position shown in FIGS. 4 and 5. In this open position, a top end 30 of the second housing section 26 is above (and extends beyond) a top end 32 of the first housing section 24.

The second housing section 26 comprises the display 22. The display 22 is visible when the device 10 is in the closed position or the open position. In the open position, the second housing section 26 is tilted towards the first housing section 24 to allow for better viewing of the display 22 while a user is using the input region 20.

It is to be noted that although the figures illustrate the first housing section 24 comprising the user input region 20 and the second housing section 26 comprising the display 22, alternate embodiments may comprise any suitable location for the user input region and display. Additionally, more than one user input region and/or display may be provided.

The second housing section 26 is connected to the first housing section 24 by arm members 34. Each of the arm members (or swivel arms) 34 comprises a first end 36 and a second end 38. The first ends 36 are pivotably connected to the first housing section 24. The second ends 38 are pivotably connected to the second housing section 26. The ends of the arm members (or links) 34 may be connected to the housing sections 24, 26 by any suitable means which allows for pivoting or rotating of the arm members 34 between the closed position and the open position. For example, the connection (or pivot points) 40 between the ends of the arm members 34 may be simple free-running pivots for example. Additionally, cylindrical hinges 42 may be provided at the connection between the first end 36 of the arm member 34 and the first housing section 24. The cylindrical hinges (or cylindrical hinge modules) 42 could also be used for damping and/or biasing or latching the device (or handset) 10 in the closed position.

Electrical interconnection between the first housing section 24 and the second housing section 26 may be made by fitting a wire or a flexible printed circuit (FPC) cable 37 along the arm members, or links, 34. However, any suitable means for electrically connecting the first housing section 24 to the second housing section 26 may be provided. Additionally, the arm members 34 may be widened or narrowed accordingly to accommodate the suitable type of electrical connection.

The second housing section 26 also comprises slots 44 proximate a first end 46 and a second end 48 of the device 10 (shown in FIGS. 4 and 5). The slots (or link recesses) 44 provide openings within the second housing section 26 which are suitably sized and shaped to receive the arm members 34 when the device 10 is in the closed position.

The device 10 further comprises a resilient member 50, such as a torsion spring for example, between the second end 38 of each of the arm members 34 and the second housing section 26. The torsion spring 50 is configured to exert a torque on the second housing section 26. The torque provides a turning force (about the pivotable connection 40 at the second ends 38 of the arm members 34) on to the second housing section 26 in a first direction 52. As the arm members 34 pivot about the cylindrical hinges 42 (when the device 10 is moved from the closed position to the open position), the second housing section 26 is moved away from the first housing section 24. The torque (in the first direction 52) exerted by the torsion spring 50 on the second housing section 26 biases an edge 54 of the second housing section 26 towards the first housing section 24 and provides a contact force therebetween. The torsion spring 50 also forces the edge 54 of the second housing section 26 into contact with the first housing section 24 and holds the device (or handset) 10 open. Thus, as the arm members 34 pivot, the edge 54 of the second housing section 26 slides across the upper face 28 of the first housing section 24.

The arm members 34 are configured to pivot in a first direction 35 when the configuration of the device 10 is changed from the closed position to the open position. The arm members 34 pivot such that the second ends 38 of the arm members 34 rotate about the cylindrical hinges 42 (at the first ends 36 of the arm members 34) and away from the first housing section 24. In the closed position the second ends 38 of the arm members 34 are proximate a middle portion of the first housing section 24. In the open position, the second ends 38 of the arm members 34 are rotated in a direction towards the top end 32 of the first housing section 24. This further places the top end 30 of the second housing section 26 above the top end 32 of the first housing section 24 such that a middle portion (along the pivot connections 40) of the second housing section 26 is proximate the top end 32 of the first housing section 24. As shown in FIGS. 4 and 5, the slots 44 may only be provided on one side of the pivot connections 40, this allows for the other side to serve as a stopper mechanism (preventing further rotation of the arm member 34) and provides the second housing section to be at an angled or tilted relationship with respect to the first housing section (the second housing section may be tilted at an acute angle "A" as shown in FIG. 4 for example). However, in alternate embodiments, instead of utilizing the non-slotted side of the second housing section 26 to prevent further rotation of the arm members 34, friction between the edge 54 of the second housing section 26 and the first housing section 24 may provide the stop mechanism.

The disclosed device 10 provides a new kind of mechanism that allows both sliding and tilting to be implemented in the device 10 with a simple mechanism. This is accomplished by providing the swivel arm 34 for cover (or second housing section) 26 movement where the second end 38 of the arm member 34 is connected to the torsion spring 50, which biases the cover (or second housing section) 26 of the device 10 into a tilted position when opened.

The slide and tilt mechanism (or opening mechanism) uses one link 34 and one torsion spring 50 per side (or end) 46, 48 of the device 10. The torsion spring 50 pulls the product into its open position, and then holds it in that position. With the pair of commercially available cylindrical hinges 42, cam portions of the hinge modules could hold the product in both its open, and closed positions. However, in an alternate embodiment, a magnetic catch 51 (or any other suitable type of catch) may be provided to keep the device 10 in a closed position. In a preferred embodiment, hinge 42 exerts no force on the arms 34 to retain the arms 34 in the open position. Instead, the torsion spring(s) 50 force the front edge 54 of the second housing section 26 into contact with the first housing section 24. It is this contact and the continued biasing force of the torsion spring(s) 50 which maintain the first and second housing sections 24, 26 at the open position until positively closed by the user with the catch 51 then being strong enough to overcome the bias of the torsion spring(s) 50 and keep the apparatus closed.

Figure 6:
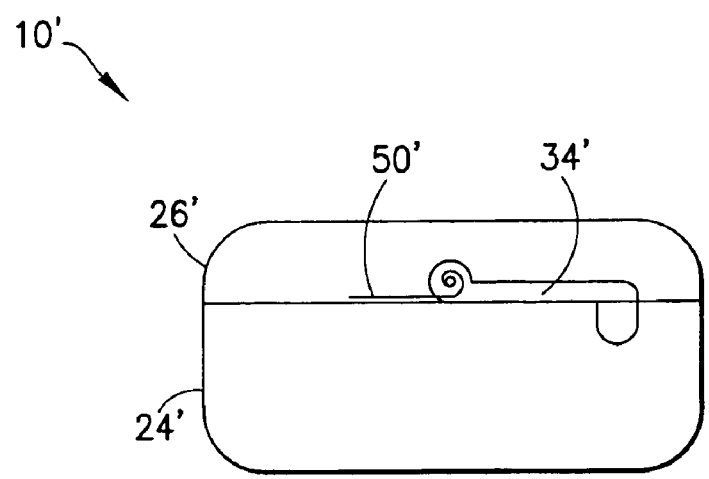
FIG. 6 is a side view of an alternative electronic device in a closed position, wherein portions of the housing are shown as transparent.
Figure 7:
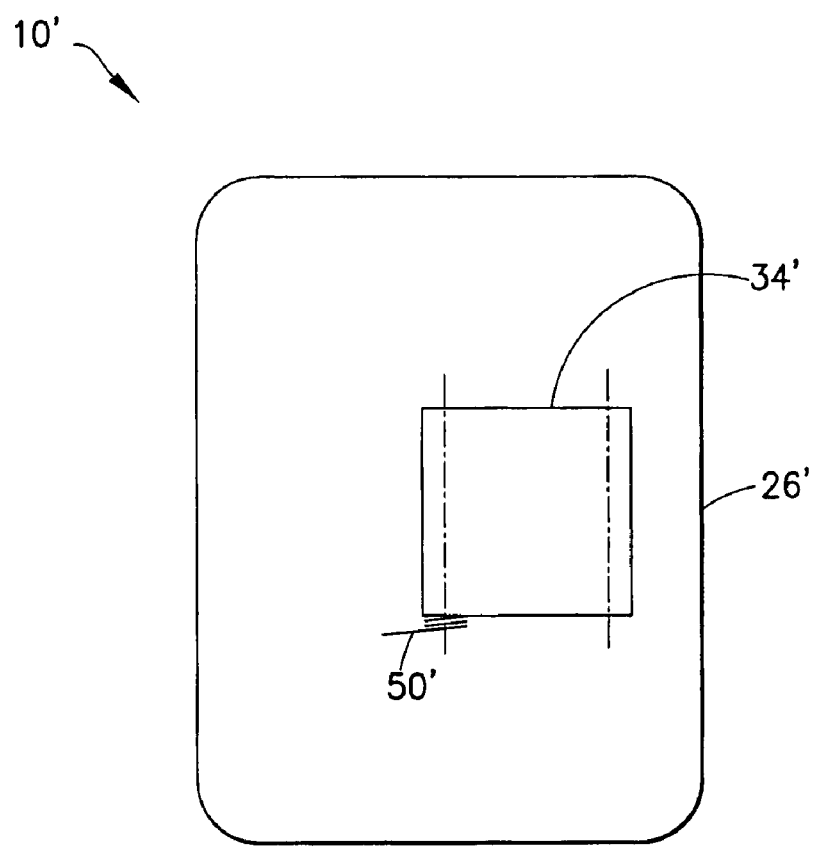
FIG. 7 is a front view of the device shown in FIG. 6 in a closed position, wherein portions of the housing are shown as transparent.
Figure 8:
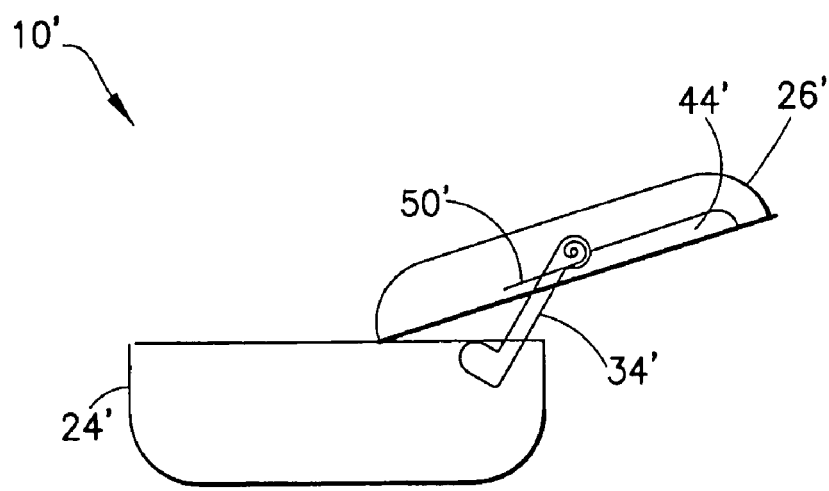
FIG. 8 is an end view of the device shown in FIG. 6 in an open position, wherein portions of the housing are shown as transparent.
Figure 9:
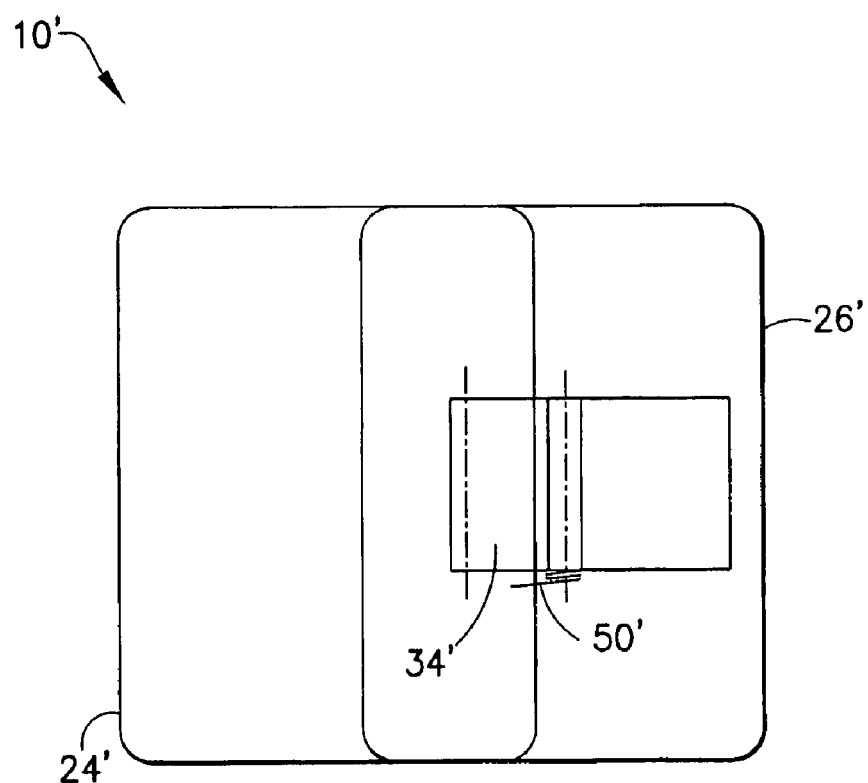
FIG. 9 is a front view of the device shown in FIG. 6 in an open position, wherein portions of the housing are shown as transparent.

It should be noted that although FIGS. 1 and 5 illustrate the device 10 comprising two arm members 34 and two torsion springs 50 connected between the first housing section 24 and the second housing section 26, alternate embodiments may comprise any suitable number of arm members 34 or torsion springs 50. For example, FIGS. 6-9 illustrate a device 10' comprising a single broad link or arm member 34' and a single torsion spring 50' connected between a first housing section 24' and a second housing section 26'. Similar to the slide and tilt mechanism implementation for the device 10, FIGS. 6 and 7 illustrate the device 10' in a closed position. FIGS. 8-9 illustrate the device 10' in an open position. The arm member 34' and torsion spring 50' are pivotably connected between the first housing section 24' and the second housing section 26' as described above for the device 10.

The disclosed device 10, 10' provides an improved configuration for transforming a two part handset product from a flat closed configuration, to an open and tilted configuration. The disclosed mechanism is implemented with very few parts, and uses very little volume in the product.

In conventional configurations, the mechanisms allowing for sliding and tilting all have either pairs of connecting links on each side of the device, or slots in the visible upper face of the lower part (or first housing section). With the disclosed configuration, the second housing section 26, 26' may be mechanically connected to the first housing section 24, 24' by only the arm member(s) 34, 34'. In other words, the slide and tilt mechanism may only comprise two link members 34 (one an each end 46, 48 of the device 10) or a single link member 34' as in the second embodiment. Additionally, the link recesses 44, 44' may only be required in second housing section 26, 26'. This is accomplished by using only the single spring 50 on each side of the device to provide the opening force (or just a single spring 50' as in the second embodiment). The disclosed location and implementation of the springs 50, 50' eliminates the need for slots in visible faces (such as the upper face 28 for example) of the device and occupies very little volume. This improves the aesthetics of the device as the link recesses 44, 44' are disposed in a portion of the device not visible to the user.

Furthermore, the slide and tilt mechanism is simple, uses very few parts, and occupies very little volume and is also a more robust configuration when compared to conventional designs. The disclosed device 10, 10' provides features (such as simple free-running pivots and commercially available cylindrical hinges, for example) allowing for low cost production, providing a good operational feel, while maintaining product reliability.

Figure 10:
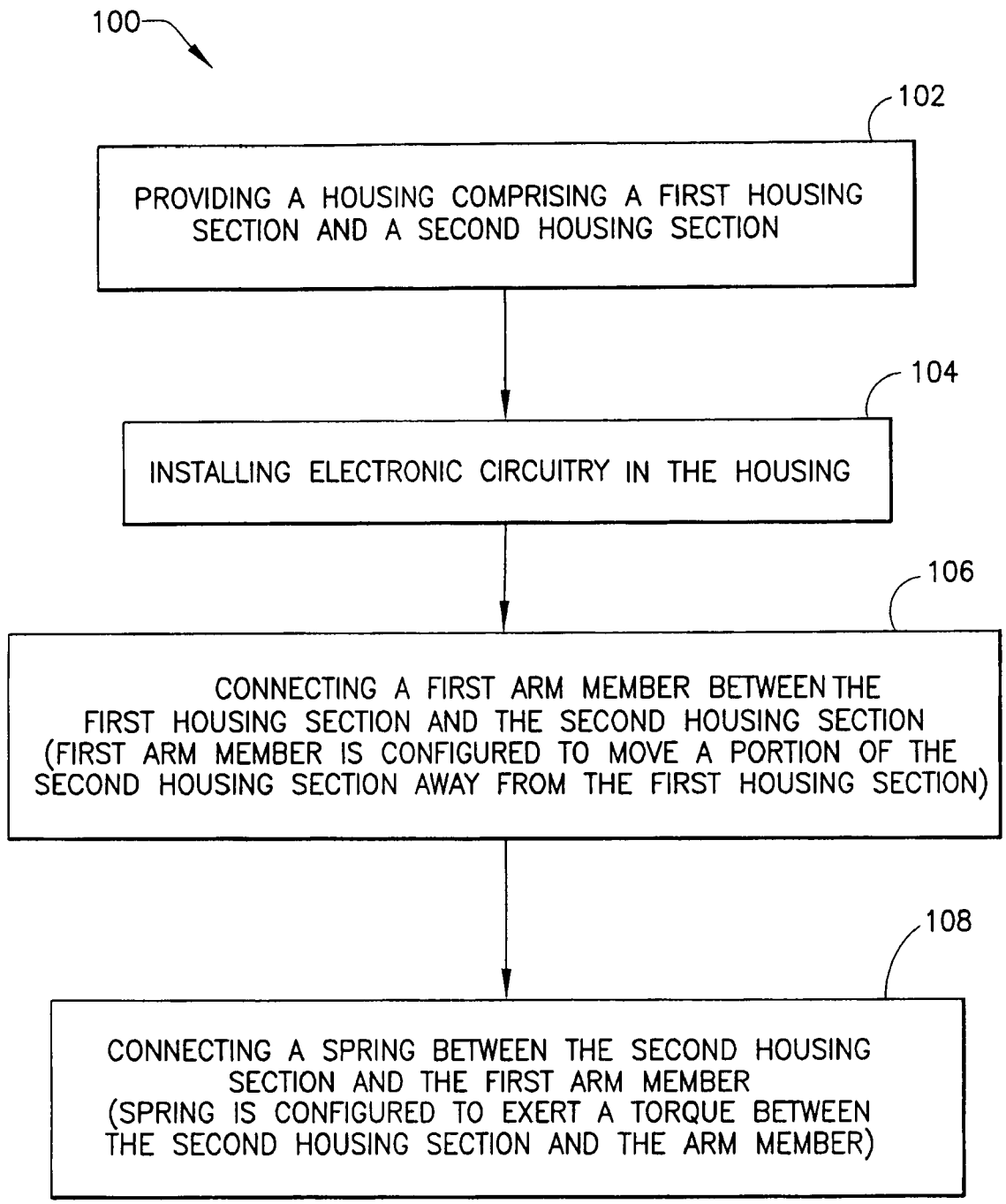
FIG. 10 is a block diagram of an exemplary method used for manufacturing the electronic device shown in FIG. 1.

FIG. 10 illustrates an exemplary method 100 for manufacturing (or assembling) the device 10. The method 100 includes the following steps. Providing a housing 12 comprising a first housing section 24 and a second housing section 26 (step 102). Installing electronic circuitry in the housing (step 104). Connecting a first arm member 34 between the first housing section 24 and the second housing section 26, wherein the first arm member 34 is configured to move a portion of the second housing section away from the first housing section (step 106). Connecting a spring 50 between the second housing section 26 and the first arm member 34, wherein the spring 50 is configured to exert a torque between the second housing section 26 and the first arm member 34 (step 108). It should be noted that any of the above steps may be performed alone or in combination with one or more of the steps.

It should be understood that the foregoing description is only illustrative of the invention. Various alternatives and modifications can be devised by those skilled in the art without departing from the invention. Accordingly, the invention is intended to embrace all such alternatives, modifications and variances which fall within the scope of the appended claims.

What is claimed is:

1. An apparatus comprising:
   a housing comprising a first housing section and a second housing section;
   electronic circuitry mounted in the housing;
   at least one arm member connected between the first housing section and the second housing section, wherein the at least one arm member is configured to move a portion of the second housing section away from the first housing section, and wherein the first housing section is mechanically connected to the second housing section by only the at least one arm member; and
   a spring connected between the second housing section and the at least one arm member, wherein the spring is configured to exert a torque between the second housing section and the at least one arm member.

2. The apparatus of claim 1 wherein the spring is a torsion spring.

3. The apparatus of claim 1 wherein the at least one arm member comprises two arm members connected between the first housing section and the second housing section.

4. The apparatus of claim 3 further comprising a torsion spring connected between the second housing section and the other of the two arm members.

5. The apparatus of claim 1 wherein the second housing section comprises a slot configured to receive the at least one arm member when the apparatus is in a closed position, and wherein an upper face of the first housing section is free of visible slots when the apparatus is in an open position.

6. An apparatus comprising:
a housing comprising a first housing section and a second housing section;
electronic circuitry mounted in the housing;
at least one arm member connected between the first housing section and the second housing section, wherein the first housing section is mechanically connected to the second housing section by only the at least one arm member; and
a resilient member connected between the second housing section and the at least one arm member, wherein the resilient member is configured to tilt the second housing section towards the first housing section, and wherein the resilient member is configured to exert a contact force between an edge of the second housing section and the first housing section;
wherein the at least one arm member is configured to move the edge of the second housing section along an upper face of the first housing section.

7. The apparatus of claim 6 wherein the resilient member is a torsion spring.

8. The apparatus of claim 6 wherein a first end of the arm member is pivotably connected to the first housing section, and wherein a second end of the arm member is pivotably connected to the second housing section.

9. The apparatus of claim 6 wherein the arm member is configured to slide the edge of the second housing section across a portion of the first housing section.

10. The apparatus of claim 6 wherein the arm member is proximate a first end of the apparatus, and wherein the apparatus comprises only a single arm member proximate the first end of the apparatus.

11. An apparatus comprising:
a housing comprising a first housing section and a second housing section;
electronic circuitry mounted in the housing;
a first arm member connected between the first housing section and the second housing section, wherein the first arm member is configured to move a portion of the second housing section above a top end of the first housing section;
a spring connected between the second housing section and the first arm member, wherein the spring is configured to tilt the second housing section towards the first housing section when the housing is in a fully open position; and
a second arm member connected between the first housing section and the second housing section;
wherein the first housing section is mechanically connected to the second housing section only by the first arm member and the second arm member.

12. The apparatus of claim 11 wherein the spring is a torsion spring.

13. The apparatus of claim 11 wherein the apparatus comprises a first end and a second end, wherein the first arm member is proximate the first end, and wherein the second arm member is proximate the second end.

14. A method comprising:
providing a housing comprising a first housing section and a second housing section;
installing electronic circuitry in the housing;
connecting at least one arm member between the first housing section and the second housing section, wherein the at least one arm member is configured to move a portion of the second housing section away from the first housing section, and wherein the first housing section is mechanically connected to the second housing section by only the at least one arm member; and
connecting a spring between the second housing section and the at least one arm member, wherein the spring is configured to exert a torque between the second housing section and the at least one arm member, and wherein the spring is configured to exert a contact force between an edge of the second housing section and the first housing section when the housing is in an open position.

15. An apparatus comprising:
at least one arm member comprising a first end and a second end, wherein the first end is configured to be pivotably connected to a first housing section, wherein the second end is configured to be pivotably connected to a second housing section, and wherein the apparatus is configured such that the first housing section is mechanically connected to the second housing section by only the at least one arm member; and
a spring connected to the second end of the at least one arm member, wherein a portion of the spring is configured to be connected to the second housing section, wherein the spring is configured to exert a torque between the second housing section and the at least one arm member, and wherein the spring is configured to pivot the second housing section with respect to the first housing section when the apparatus is in an open position.

16. The apparatus of claim 15 wherein the spring is a torsion spring.

17. The apparatus of claim 15 wherein the spring is configured to hold the second housing section in an open position.

18. The apparatus of claim 15 wherein the arm member is configured to slide an edge of the second housing section across a portion of the first housing section.

* * * * *